United States Patent
Shin et al.

(10) Patent No.: US 8,427,841 B2
(45) Date of Patent: Apr. 23, 2013

(54) ELECTRONIC DEVICE

(75) Inventors: Dong-Kil Shin, Hwaseong-si (KR); Shle-Ge Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 392 days.

(21) Appl. No.: 12/662,218

(22) Filed: Apr. 6, 2010

(65) Prior Publication Data

US 2010/0259912 A1  Oct. 14, 2010

(30) Foreign Application Priority Data

Apr. 9, 2009  (KR) .................. 10-2009-0030906

(51) Int. Cl.
*H05K 7/00* (2006.01)

(52) U.S. Cl.
USPC ........... 361/784; 361/760; 361/803; 257/686; 257/737; 257/738

(58) Field of Classification Search .................. 361/784, 361/760, 803; 257/686, 737, 738
See application file for complete search history.

(56) References Cited

U.S. PATENT DOCUMENTS

| | | | | |
|---|---|---|---|---|
| 5,334,804 A | * | 8/1994 | Love et al. | 174/267 |
| 5,889,326 A | * | 3/1999 | Tanaka | 257/737 |
| 6,125,043 A | * | 9/2000 | Hauer et al. | 361/760 |
| 7,943,860 B2 | * | 5/2011 | Mizuhara | 174/261 |
| 2001/0053068 A1 | * | 12/2001 | Murayama et al. | 361/760 |
| 2005/0205980 A1 | * | 9/2005 | Manansala | 257/680 |
| 2007/0035009 A1 | | 2/2007 | Hwang et al. | |

FOREIGN PATENT DOCUMENTS

| | | |
|---|---|---|
| JP | 2007-189084 | 7/2007 |
| KR | 10-1998-0058450 | 10/1998 |
| KR | 10-2007-0019475 | 2/2007 |

* cited by examiner

*Primary Examiner* — Tuan T Dinh
*Assistant Examiner* — Hung Dang
(74) *Attorney, Agent, or Firm* — Harness, Dickey & Pierce, P.L.C.

(57) ABSTRACT

Provided is an electronic device which may include a first structure having a first surface, a first land region on the first surface, a second structure having a second surface facing the first surface, a second land region on the second surface, and a connection structure between the first and second structures electrically connecting the first land region to the second land region. As provided, the first land region may have a major axis and a minor axis on the first surface and the second land region may have a major axis and a minor axis on the second surface. Furthermore, the major axes of the first and second land regions may have different orientations with respect to one another.

6 Claims, 9 Drawing Sheets

ELECTRONIC DEVICE

PRIORITY STATEMENT

This application claims the benefit of priority under 35 U.S.C. §119 from Korean Patent Application No. 10-2009-0030906, filed on Apr. 9, 2009, in the Korean Intellectual Property Office (KIPO), the contents of which are hereby incorporated herein by reference in its entirety.

BACKGROUND

1. Field

Example embodiments relate to an electronic device, and more particularly, to an electronic device associated with a semiconductor package.

2. Description of Related Art

Solder balls have been used in semiconductor packages. For example, solder balls have been used to electrically connect a plurality of semiconductor chips to each other, thereby forming a stacked semiconductor package. As another example, solder balls have been used to electrically connect a semiconductor to a circuit board. As still another example, solder balls have been used to mount a circuit board having a semiconductor chip on a main board.

SUMMARY

Example embodiments provide an electronic device having a connection structure capable of improving board level reliability.

In accordance with an example embodiment, an electronic device may include a first structure having a first surface, a first land region on the first surface, a second structure having a second surface facing the first surface, a second land region on the second surface, and a connection structure between the first and second structures electrically connecting the first land region to the second land region. In accordance with this example embodiment, the first land region may have a major axis and a minor axis on the first surface and the second land region may have a major axis and a minor axis on the second surface. Furthermore, the major axes of the first and second land regions may have different orientations with respect to each other.

In accordance with another example embodiment, an electronic device may include a first structure having a first surface, a first land region on the first surface, a second structure having a second surface facing the first surface, a second land region on the second surface, and a connection structure between the first and second structures. In accordance with this example embodiment, the first land region may have one of a polygonal and circular shape and the second land region may have a major and minor axes on the second surface. Furthermore, the connection structure may electrically connect the first land region to the second land region.

In accordance with another example embodiment, an electronic device may include a first structure having a first surface, a first land region on the first surface, a second structure having a second surface facing the first surface, a second land region on the second surface, and a connection structure between the first and second structures. In accordance with this example embodiment the first land region may have a first polygonal shape and the second land region may have a second polygonal shape and the connection structure may electrically connect the first land region to second land region. Furthermore, in this example embodiment, the first land region and the second land region may be arranged so that a projection of sides of the first land region onto the second land region crosses over sides of the second land region.

In accordance with an example embodiment of an electronic device, an electronic device may include a first structure having a first surface. A first land region may be provided to the first surface. The first land region may have a major axis and a minor axis on the first surface. In this example embodiment, a second structure having a second surface facing the first surface may be provided. A second land region may be provided on the second surface. The second land region may a major axis and a minor axis on the second surface. In this example embodiment, a connection structure interposed between the first and second structures and electrically connected to the first and second land regions may be provided. The major axes of the first and second land regions may have different orientations from each other.

In some example embodiments, the first land region may be formed in a polygonal or circular shape, or in the shape of a combination of straight and curved lines.

In another example embodiment, the second land region may be formed in a polygonal or circular shape, or in the shape of a combination of straight and curved lines.

In still another example embodiment, a center region of the first land region and a center region of the second land region may be perpendicularly disposed at opposite sides of the connection structure.

In yet another example embodiment, one of the first and second structures may include a semiconductor chip.

In yet another example embodiment, the connection structure may be a reflowed ball structure.

In yet another example embodiment, the electronic device may further include a third land region provided on the first surface of the first structure and having a major axis of a different orientation from that of the first land region, a fourth land region provided on the second surface of the second structure and having a major axis of a different orientation from that of the second land region, and a ball structure interposed between the third land region and the fourth land region. In this example embodiment, the major axes of the third and fourth land regions may have different orientations from each other.

Example embodiments are also directed to an electronic device, in which one of land regions has major and minor axes. In accordance with this example embodiment, the example electronic device may include a first structure having a first surface. A polygonal or circular first land region may be provided On the first surface. A second structure having a second surface facing the first surface may be provided. A second land region may be provided on the second surface. In this example embodiment, the second land region may have major and minor axes on the second surface. In this example embodiment, a connection structure may be interposed between the first and second structures, and the connection structure may electrically connect to the first and second land regions.

In some example embodiments, at least one of the first and second structures may include a semiconductor chip.

Example embodiments are also directed to an electronic device having polygonal land regions. In this example embodiment, the electronic device may include a first structure having a first surface. A first land region formed in a first polygonal shape may be provided on the first surface. In this example embodiment a second structure having a second surface facing the first surface may be provided. A second land region formed in a second polygonal shape may be provided on the second surface. In this example embodiment, a connection structure may be interposed between the first and second structures and the connection structure may be electrically connected to the first and second land regions. In this example embodiment, an imaginary region may be formed by perpendicularly extending from the first land region to the second land region, and disposed on the same plane as the second land region. The imaginary region has imaginary sides crossing sides of the second land region.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1A:
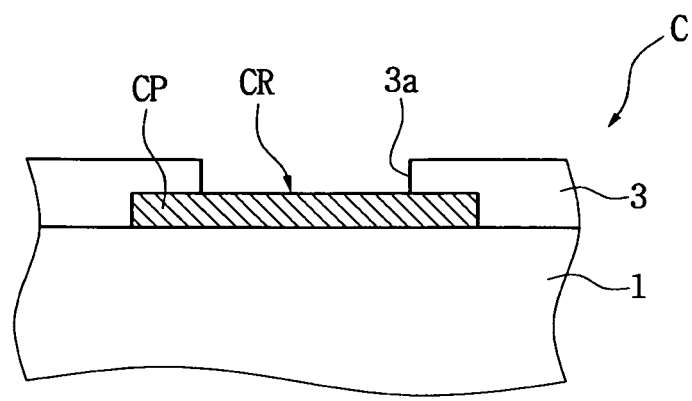
FIG. 1A is a cross-sectional view of a first structure illustrating an electronic device according to example embodiments.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the shapes.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the shapes. It will be understood that the spatially relative terms are intended to encompass different orientations of the device in use or operation in addition to the orientation depicted in the Shapes. For example, if the device in the shapes is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implantation concentration) at its edges rather than an abrupt change from an implanted region to a non-implanted region. Likewise, a buried region formed by implantation may result in some implantation in the region between the buried region and the surface through which the implantation may take place. Thus, the regions illustrated in the shapes are schematic in nature and their shapes do not necessarily illustrate the actual shape of a region of a device and do not limit the scope.

It should also be noted that in some alternative implementations, the functions/acts noted may occur out of the order noted in the shapes. For example, two shapes shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Figure 1B:
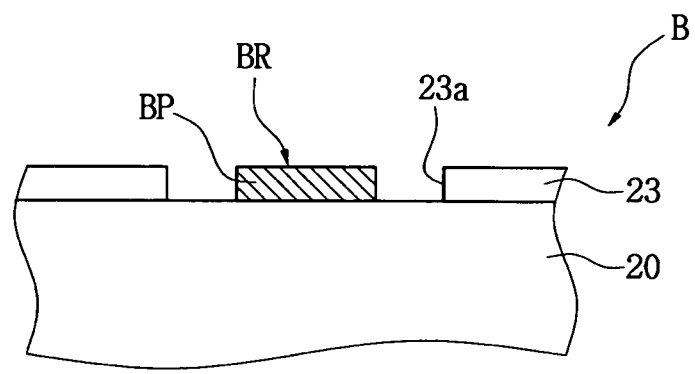
FIG. 1B is a cross-sectional view of a second structure illustrating an electronic device according to example embodiments.
Figure 2:
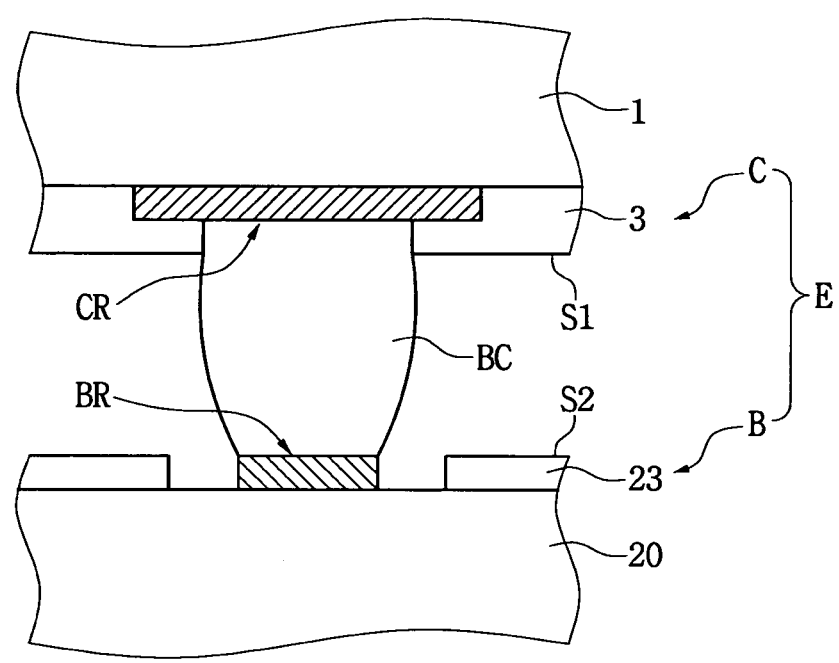
FIG. 2 is a cross-sectional view of an electronic device according to example embodiments.
Figure 4A:
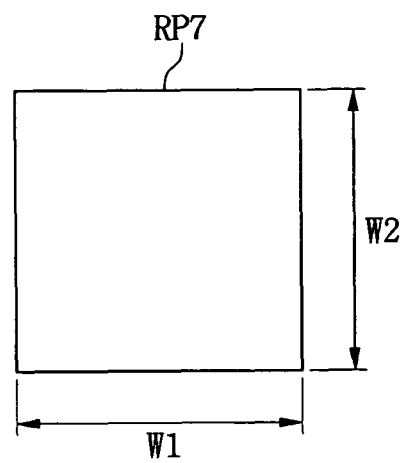
Figure 4B:
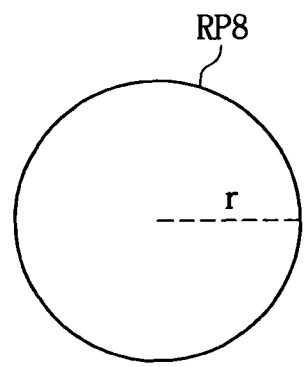
Figure 5:
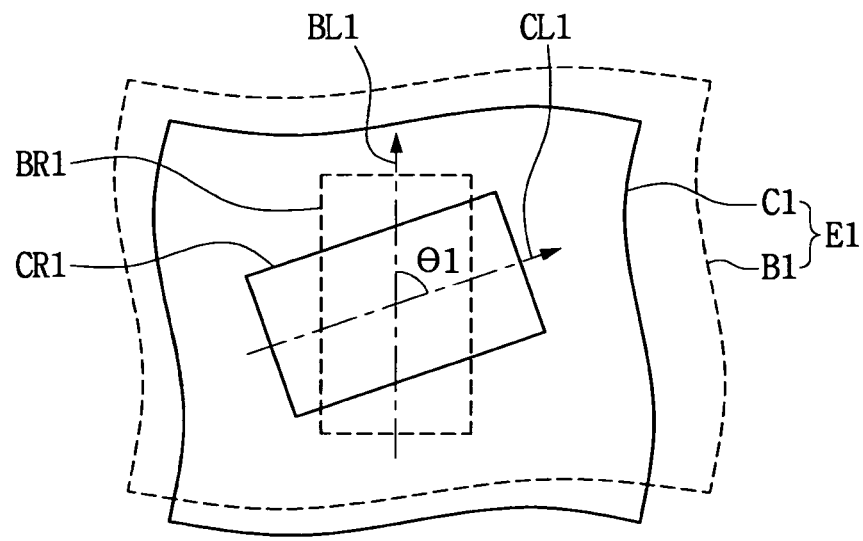
FIG. 5 is a plan view of an electronic device according to an example embodiment.
Figure 6:
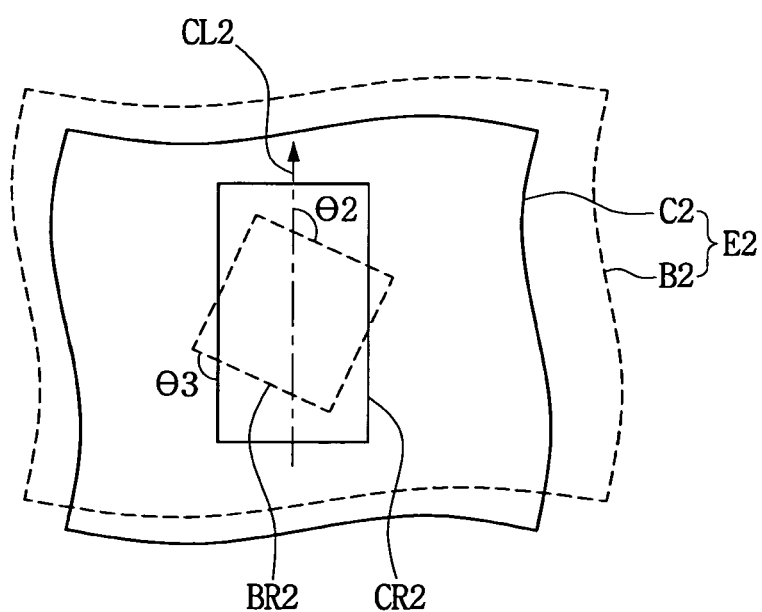
FIG. 6 is a plan view of an electronic device according to another example embodiment.
Figure 7:
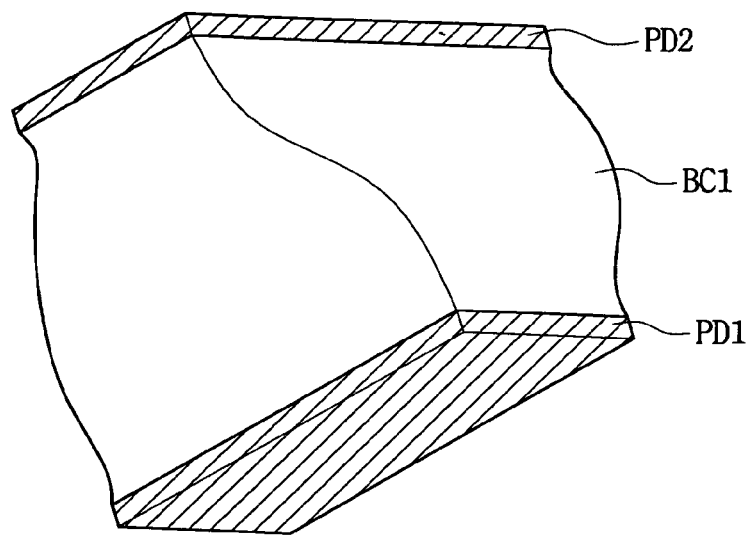
FIGS. 7 and 8 are three-dimensional views of connection structures constituting an electronic device according to example embodiments.
Figure 8:
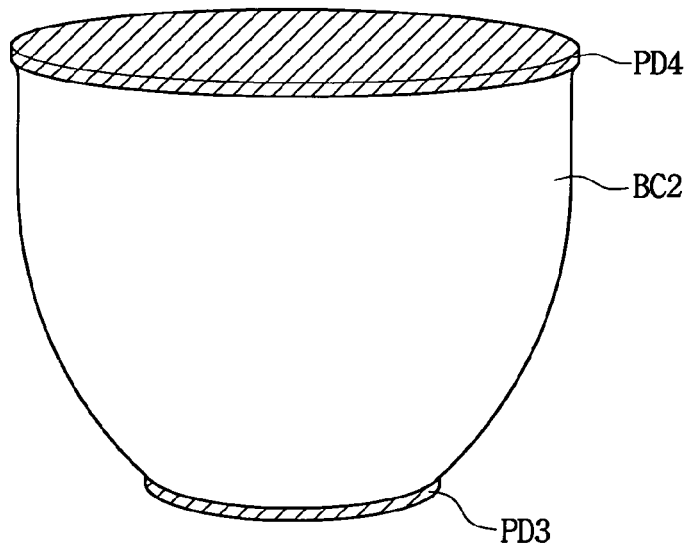
Figure 9:
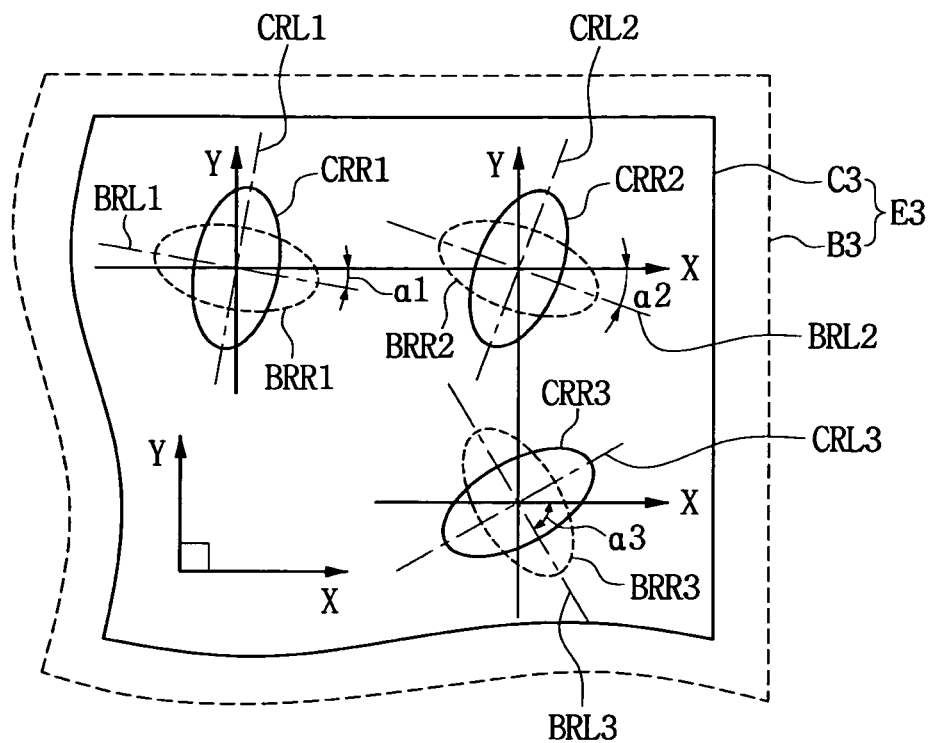
FIG. 9 is a plan view of an electronic device according to still another example embodiment.

FIG. 1A is a cross-sectional view of a first structure illustrating an electronic device according to example embodiments and FIG. 1B is a cross-sectional view of a second structure illustrating an electronic device according to example embodiments. FIG. 2 is a cross-sectional view of an electronic device according to example embodiments. FIGS. 3A through 4B are plan views of various land regions constituting an electronic device according to example embodiments. FIG. 5 is a plan view of an electronic device according to an example embodiment. FIG. 6 is a plan view of an electronic device according to another example embodiment. FIGS. 7 and 8 are three-dimensional views of connection structures constituting an electronic device according to example embodiments. FIG. 9 is a plan view of an electronic device according to still another example embodiment.

Structures such as chips and boards are among the principal components constituting an electronic device according to example embodiments. These structures will be briefly described with reference to FIGS. 1A and 1B.

Referring to FIG. 1A, a first structure C may be a board structure such as a printed circuit board (PCB) or a circuit board or main board having a semiconductor chip, or a chip structure such as a semiconductor chip. The first structure C may include a first body 1 and a first pad CP provided on one surface of the first body 1.

In addition to the first pad CP, a plurality of pads may be provided on one surface of the first body 1. The first pad CP may include a conductive material such as copper or aluminum.

A first insulating protective layer 3 having a first opening 3a exposing the first pad CP may be provided on the first body 1. The first opening 3a may expose at least a part of a top surface of the first pad CP. For example, the first protective layer 3 may cover an edge of the first pad CP as well as sidewalls of the first pad CP. Here, the region of the first pad CP exposed by the first opening 3a is defined as a first land region CR.

Referring to FIG. 1B, a second structure B may be a board structure such as a printed circuit board (PCB) or a circuit board or main board having a semiconductor chip, or a chip structure such as a semiconductor chip. The second structure B may include a second body 20, and a second pad BP provided on one surface of the second body 20. A plurality of pads may be provided on one surface of the second body 20 in addition to the second pad BP. The second pad BP may include a conductive material such as copper or aluminum.

A second insulating protective layer 23 having a second opening 23a exposing the second pad BP may be provided on the second body 20. The second opening 23a may expose at least a part of a top surface of the second pad BP. The second opening 23a of the second protective layer 23 may expose sidewalls of the second pad BP as well as the top surface of the second pad BP. Here, the top surface of the second pad BP exposed by the second opening 23a is defined as a second land. region BR.

The electronic device according to the example embodiments may be fabricated by electrically connecting two substrate structures, for example, a board structure to a chip structure using a connection structure. Here, the board structure may be a printed circuit board for mounting a semiconductor chip, or a circuit board, main board or mother board having a semiconductor chip mounted thereon. In addition, the chip structure may be a structure including a semiconductor chip. In the substrate structures, a portion electrically connected to the connection structure is defined as a land region. Hereinafter, the electronic device in the example embodiment will be described with reference to FIG. 2 in further detail.

Referring to FIG. 2, the first structure C described with reference to FIG. 1A may be electrically connected to the second structure B described with reference to FIG. 1B by a connection structure BC. The connection structure BC may be in electrical contact with the first land region CR provided on a first surface S1 of the first structure C and the second land region BR provided on a second surface S2 of the second structure B. Thus, an electronic device E including the first and second structures C and B connected by the connection structure BC may be provided.

The connection structure BC may be a reflowed ball structure. For example, the reflowed ball structure BC may be formed by forming a solder ball on the first land region CR, contacting the first structure C having the solder ball and the second structure B, and reflowing the solder ball to electrically connect the first land region CR to the second land region BR. That is, the connection structure BC may be formed by a solder ball junction process.

In the example embodiment, the example of connecting the first and second structures C and B to each other with reference to FIGS. 1A and 1B is described, but the inventive concepts are not limited thereto. For example, the inventive concepts may be used to form a stacked semiconductor package in which a plurality of semiconductor chips are stacked, or mount one or more semiconductor chips on one board.

In the example embodiment, the shape of the connection structure BC may be determined by shapes and/or sizes of the first and second land regions CR and BR, which are in contact with the connection structure BC. At least one of the first and second land regions CR and BR may have a major and a minor axis. The first and second land regions CR and BR may be different from each other in at least one of the shape, orientation of the major axis and size. For example, at least one of the first and second land regions CR and BR may be formed in a polygonal or oval shape having a major and a minor axis, or in a combination shape of straight and curved lines. A length ratio of the major axis to the minor axis may be approximately 10:1 to 10:9. For example, the land region may be formed to have the length ratio of the major axis to the minor axis of about 2:1. Various land regions having the major and minor axes will be described with reference to FIGS. 3A to 3F.

Figure 3A:
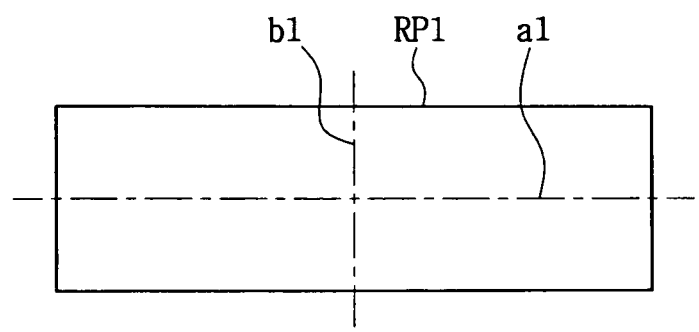
FIGS. 3A through 4B are plan views of various land regions constituting an electronic device according to example embodiments.

Referring to FIG. 3A, a quadrangular land region RP1 having a major axis al and a minor axis b1 may be provided. For example, the quadrangular land region RP1 may be formed in a rectangular shape. A vertical length of the rectangular land region may be about 10 to 90% of a horizontal length thereof.

Figure 3B:
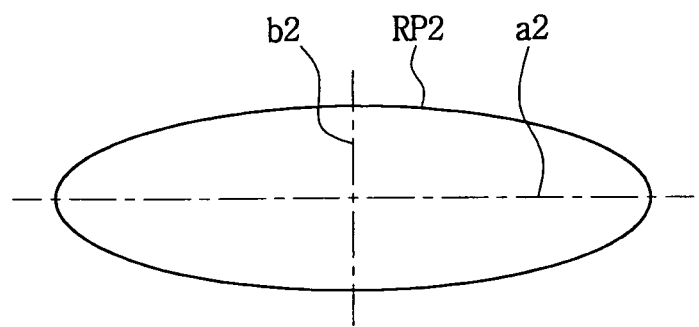

Referring to FIG. 3B, an oval land region RP2 having a major axis a2 and a minor axis b2 may be provided.

Figure 3C:
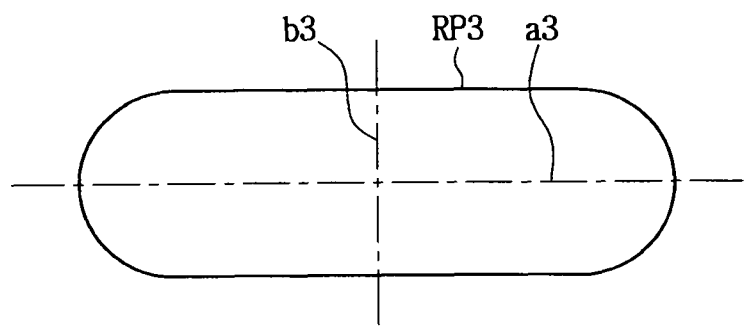
Figure 3D:
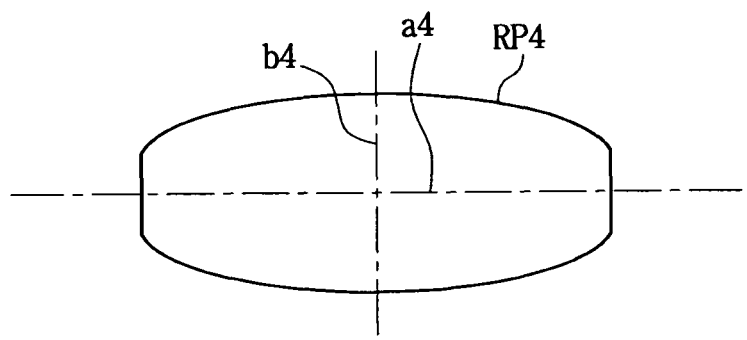

Referring to FIGS. 3C and 3D, a land region formed in a combination of straight and curved lines may be provided. For example, a land region formed of two separated straight lines and two semi-circular curved lines, which connect edges of the straight lines and face each other, may be provided. Here, the semi-circular curved lines may be formed in a convex shape toward outside. The land region, as shown in FIG. 3C, may be a land region RP3 in which separated straight sides are disposed on the line of a minor axis b3, and curved sides connecting the straight sides to each other are disposed on the line of a major axis a3. Alternatively, as shown in FIG. 3D, the land region may be a land region RP4 in which separated straight sides disposed on the line of a major axis a4, and curved sides connecting the straight sides to each other are disposed on the line of a minor axis b4.

Figure 3E:
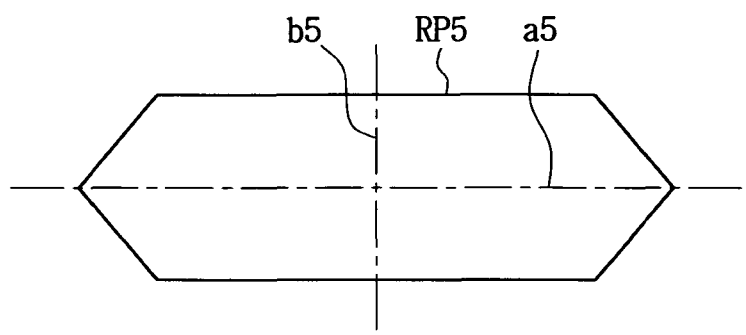
Figure 3F:
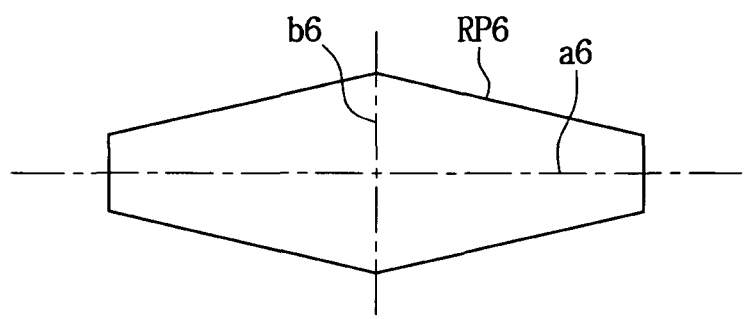

Referring to FIGS. 3E and 3F, a hexagonal land region may be provided. For example, referring to FIG. 3E, a hexagonal land region RP5 in which two vertexes are disposed on the line of a major axis a5 and two straight sides are disposed on the line of a minor axis b5 may be provided. Alternatively, referring to FIG. 3F, a hexagonal land region RP6 in which two vertexes are disposed on the line of a minor axis b6 and two straight sides are disposed on the line of a major axis a6 may be provided.

One of the first and second land regions CR and BR which are separated from each other with the connection structure BC interposed therebetween may have major and minor axes, and the other may be formed in a regular polygonal or circular shape. For example, one of the first and second land regions CR and BR may be one of the land regions RP1, RP2, RP3, RP4, RP5 and RP6 described with reference to FIGS. 3A through 3F, and the other may be a square land region RP7 in which a horizontal length W1 is the same as a vertical length W2 as shown in FIG. 4A, or a circular land region RP8 whose radius is "r" as shown in FIG. 4B.

Thus, a chip or board structure having one of the land regions RP1, RP2, RP3, RP4, RP5 and RP6 described with reference to FIGS. 3A through 3F and a chip or board structure having one of the land regions RP1, RP2, RP3, RP4, RP5, RP6, RP7 and RP8 described with reference to FIGS. 3A through 4B may be provided. These structures may be electrically connected to each other by the connection structure BC.

As described above, the shape of the connection structure BC may be determined by the first and second land regions CR and BR in contact with the connection structure BC, and at least one of the shapes, orientations of the major axis and sizes of the first and second land regions CR and BR may be different from each other. Hereinafter, example arrangements or shapes of the first and second land regions CR and BR will be described with reference to FIGS. 5 and 6 to more easily understand example embodiments of the inventive concepts. Here, FIGS. 5 and 6 illustrate example arrangements of the first and second land regions CR and BR which are electrically connected to each other by the connection structure BC. Thus, to easily understand the example embodiments of the inventive concepts and prevent the complexity of the drawings, components such as connection structures and interconnections will not be shown. For clarity, one of the first and second structures connected by the connection structure is referred to as the board structure, and the other is referred to as the chip structure. Further, a land region provided on the board structure is referred to as a board land region, and a land region provided on the chip structure is referred to as a chip land structure. To describe the relationship between the board land region and the chip land region, it is assumed that the board land region and the chip land region are disposed on the same plane. In other words, an imaginary region is designed to perpendicularly extend from the board eland region to the chip land region and be disposed on the same plane as the chip land region, and it is assumed that the board land region is disposed in the imaginary region to describe the relationship between the board land region and the chip land region. A center region of the chip land region and a center region of the board land region may be perpendicularly disposed at opposite sides of the connection structure. That is, when it is assumed that the chip land region and the board land region are disposed on the same plane, the center regions of the chip land region and the board land region may be matched within an error tolerance of the process.

Referring to FIG. 5, a first board structure B1 and a first chip structure C1 may be provided to face each other. In addition, a first board land region BR1 may be provided on the first board structure B1 facing the first chip structure C1. Likewise, a first chip land region CR1 may be provided on the first chip structure C1 facing the first board structure B1. A connection structure (BC of FIG. 2) as described with reference to FIG. 2 may be interposed between the first board land region BR1 and the first chip land region CR1. Thus, a first electronic device E1 including the first chip structure C1 and the first board structure B1 which are connected to each other by the connection structure may be provided.

Both the first board land region BR1 and the first chip land region CR1 may be formed in a rectangular shape having major and minor axes as described in FIG. 3A. However, the first board land region BR1 and the first chip land region CR1, in which the first board structure B1 and the first chip structure C1 are connected to each other by the connection structure, may be formed in rectangular shapes having different orientations of major axes. For example, a major axis BL1 of the first board land region BR1 and a major axis CL1 of the first chip land region CR1 may cross each other at a an angle which is not 0°. For example, the first chip land region CR1 may be provided to have a major axis CL1 inclined at an angle θ1 of about 5 to 175° based on the major axis BL1 of the first board land BR1. In example embodiments, the angle may or may not be predetermined.

As shown in FIG. 5, the first board land region BR1 may be arranged over the first chip land region CR such that if sides of the first beard land region BR1 were projected onto the first chip land region CR, the projected sides of the first board land region BR1 would cross over the sides of the first chip land region CR.

In the example embodiment, the first board land region BR1 and the first chip land region CR1 may be formed in the shape of a rectangular land region RP1 as shown in FIG. 3A, but the example embodiments of the inventive concepts is not limited thereto. For example, the first board land region BR1 may be formed in the shape of one of the land regions RP1, RP2, RP3, RP4, RP5 and RP6 described with reference to FIGS. 3A through 3F, the first chip land region CR1 may be formed in the shape of one of the land regions RP1, RP2, RP3, RP4, RP5 and RP6 described with reference to FIGS. 3A through 3F, and the first board land region BR1 may be formed in a different shape from the first chip land region CR1.

Referring to FIG. 6, a second board structure B2 and a second chip structure C2 may be provided to face each other. A second board land region BR2 may be provided on the second board structure B2 facing the second chip structure C2. Likewise, a second chip land region CR2 may be provided on the second chip structure C2 facing the second board structure B2. A connection structure (BC of FIG. 2) as described with reference to FIG. 2 may be interposed between the second board land region BR2 and the second chip land region CR2. Thus, a second electronic device E2 including the second chip structure C2 and the second board structure B2 connected by the connection structure may be provided.

The second board land region BR2 in contact with one end of the connection structure (BC of FIG. 2) may have a different shape from the second chip land region CR2 in contact with the other end of the connection structure (BC of FIG. 2). For example, the second board land region BR2 may be formed in the shape of one of the land regions RP1, RP2, RP3, RP4, RP5 and RP6 having the major and minor axes as described with reference to FIGS. 3A through 3F, and the second chip land region CR2 may be formed in the shape of one of the regular polygonal and circular land regions RP7 and RP8 as described with reference to FIGS. 4A and 4B. Alternatively, the second board land region BR2 may be formed in the shape of one of the regular polygonal and circular land regions RP7 and RP8 as described with reference to FIGS. 4A and 4B, and the second chip land region CR2 may be formed in the shape of one of the land regions RP1, RP2, RP3, RP4, RP5 and RP6 having the major and minor axes as described with reference to FIGS. 3A through 3F. FIG. 6 illustrates that the second board land region BR2 is formed in a regular polygonal shape, for example, a square shape as described with reference to FIG. 4A, and the second chip land region CR2 is formed in a rectangular shape as described with reference to FIG. 3A.

The sides of the square second board land region BR2 contacting the major axis CL2 of the second chip land region CR2 may cross each other at an angle θ2, which is not 0°. In this example embodiment, the angle θ2 may or may not be predetermined. In addition, the sides of the second board land region BR2 contacting the sides of the second chip land region CR2 may cross each other at an angle θ3, which is not 0°. In this example embodiment, the angle θ3 may or may not be predetermined.

The second board land region BR2 and the second chip land region CR2 may be formed in a square shape. Here, the sides of the second board land region BR2 and the sides of the second chip land region CR2 may cross each other at an angle, which is not 0°. In this example embodiment, the angle may or may not be predetermined.

To easily understand the example embodiments of the inventive concepts, shapes of the connection structures will be described with reference to FIGS. 7 and 8.

FIG. 7 three-dimensionally illustrates the connection structure BC1 interposed between rectangular land regions PD1 and PD2 having an aspect ratio of about 2:1. Here, when it is assumed that the land regions PD1 and PD2 are disposed on the same plane, major axes of the land regions PD1 and PD2 cross each other at an angle of about 90°. As shown in FIG. 7, the connection structure BC1 may have different widths according to the position. For example, the width of the connection structure BC 1 connecting a horizontal side of one land region PD1 to a vertical side of the other land region PD2 may be gradually reduced. That is, since the major axes of the land regions PD1 and PD2 have crossed orientations, as shown in FIG. 7, the width of the connection structure BC1 may be changed according to a viewing direction.

FIG. 8 three-dimensionally illustrates the ball structure BC2 interposed between the oval land region PD4 and the circular land region PD3. A width of the connection structure BC2 interposed between the oval land region PD4 and the circular land region PD3 may also be determined by the size of the oval land region PD4.

Next, an electronic device according to still another example embodiment will be described with reference to FIG. 9.

Referring to FIG. 9, a lower structure B3 and an upper structure C3 may be provided to face each other. The lower structure B3 may be a chip structure or a board structure, and the upper structure C3 may be a chip structure. A plurality of lower land regions may be provided on a surface of the lower structure B3 facing the upper structure C3. Likewise, a plurality of upper land regions may be provided on a surface of the upper structure C3 facing the lower structure B3. The upper land regions may be formed at a position corresponding to the lower land regions, and may be electrically connected to the lower land regions by a connection structure formed by substantially the same method as the connection structures BC, BC1 and BC2 described with reference to FIGS. 4, 7 and 8. Thus, an electronic device E3 including the lower structure B3 and the upper structure C3 electrically connected to each other by the connection structure may be provided.

In FIG. 9, CRR1, CRR2, and CRR3 may represent a first plurality of land regions on a first surface of a first structure C3. As shown in FIG. 9, each of the land regions of the first plurality of land regions has a major axis and each of the major axes of the land regions of the first plurality of land regions are oriented differently from one another. For example, the major axis CRL1 of land region CRR1 is oriented differently the major axis CRL2 of the land region CRR2.

In FIG. 9, BRR1, BRR2, and BRR3 may represent a second plurality of land regions on a second surface of a second structure B3, and each of the land regions of the second plurality of land regions may have a major axis and each of the major axes of the land regions of the second plurality of land regions may be oriented differently from one another. For example, the major axis BRL1 of the land region BRR1 is oriented differently from the major axis BRL2 of the land region BRR2.

The device illustrated in FIG. 9 shows that each of the land regions of the first plurality of land regions CRR1, CRR2, CRR3 connects to a corresponding land region of the second plurality of land regions BRR1, BRR2, BRR3 to form a plurality of connected land region units. For example, land region BRR1, land region CRR1, and a connection unit connecting land region BRR1 to land region CRR1 may be considered a land region unit. As another example, land region BRR2, land region CRR2, and a connection unit connecting land region BRR2 to land region CRR2 may be considered another land region unit. As another example, land region BRR3, land region CRR3, and a connection unit connecting land region BRR3 to land region CRR3 may be considered another land region unit. In short, FIG. 9 illustrates a plurality of three land region units.

As shown in FIG. 9, each of the land region units may include a first unit land region from the first plurality of land regions CRR1, CRR2, CRR3, a second unit land region from the second plurality of land regions BRR1, BRR2, and BRR3, and a connection unit structure from the plurality of connection structures. For example, CRR1, BRR1, and the connecting structure connecting them may be considered a connection structure. In more detail, CRR1 may represent a first unit land region from the first plurality of land regions CRR1, CRR2, CRR3 and BRR1 may represent a second unit land region from the second plurality of land regions BRR1, BRR2, BRR3. In this example, the first unit land region CRR1 may have a first major axis CRL1 and the second unit land region BRR1 may have a second major axis BRL1. Furthermore, in each of the land region units, the first major axes of the first unit land region may be oriented differently from the second major axis of the second unit land region.

In some example embodiments, the upper land regions may have different sizes or shapes from each other. The lower land regions may have different sizes or shapes from each other.

In another example embodiment, the upper land regions may include first to third upper land regions CRR1, CRR2 and CRR3, and the lower land regions may include first to third lower land regions BRR1, BRR2 and BRR3. On the basis of the X-Y coordinates, which are perpendicular to each other, in the lower and upper structures C3 and B3 connected by the connection structures, major axes BRL1, BRL2 and BRL3 of the first to third lower land regions BRR1, BRR2 and BRR3 may have different orientations from each other. For example, the major axis BRL1 of the first lower land region BRR1 may be inclined at a first angle α1 based on the X axis, the major axis BRL2 of the second lower land region BRR2 may be inclined at a second angle α2, which is different from the first angle α1, based on the X axis, and the major axis BRL3 of the third lower land region BRR3 may be inclined at a third angle α3, which is different from the first and second angles α1 and α2, based on the X axis. Major axes CRL1, CRL2 and CRL3 of the first to third upper land regions CRR1, CRR2 and CRR3 may also have different orientations from each other. Among the first to third upper land regions CRR1, CRR2 and CRR3 and the first to third lower land regions BRR1, BRR2 and BRR3, two random land regions electrically connected by the connection structure may have major axes having different orientations from each other.

The lower and upper structures C3 and B3 may have different thermal expansion coefficients. As the lower and upper land regions BRR1, BRR2, BRR3, CRR1, CRR2 and CRR3 may be formed to have major axes having different orientations from each other, even though the lower and upper structures C3 and B3 thermally expand in different degrees, stresses applied to the connection structures interposed between the lower and upper land regions BRR1, BRR2, BRR3, CRR1, CRR2 and CRR3 can be effectively dispersed.

According to example embodiments, a connection structure electrically connected to first and second structures facing each other may be provided. The connection structure may be in contact with a first land region of the first structure, and also in contact with a second land region of the second structure. The connection structure may be formed to have different widths from bottom to top according to a viewing position. Thus, the connection structure can be formed relatively thick at a portion on which stress is concentrated due to a change in temperature. As a result, an electronic device having a connection structure capable of improving board level reliability may be provided.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. An electronic device, comprising:
    a first structure having a first surface;
    a first land region on the first surface, the first land region having a major axis and a minor axis on the first surface;
    a second structure having a second surface facing the first surface;
    a second land region on the second surface, the second land region having a major axis and a minor axis on the second surface;
    a third land region on the first surface of the first structure;
    a fourth land region on the second surface of the second structure;
    a first connection structure between the first and second structures electrically connecting the first land region to the second land region; and
    a second connection structure between the third and fourth land regions, wherein
    the major axes of the first and second land regions have different orientations with respect to each other,
    the third land region has a major axis of a different orientation from that of the major axis of the first land region,
    the fourth land region has a major axis of a different orientation from that of the major axis of the second land region, and
    the major axes of the third and fourth land regions have different orientations from each other.

2. The device according to claim 1, wherein a shape of the first land region is one of polygonal, circular, and a shape defined by a combination of straight and curved lines.

3. The device according to claim 1, wherein a shape of the second land region is one of polygonal, circular, and a shape defined by combination of straight and curved lines.

4. The device according to claim 1, wherein the first land region and the second land region have center regions at opposite sides of the first connection structure.

5. The device according to claim 1, wherein at least one of the first and second structures includes a semiconductor chip.

6. The device according to claim 1, wherein the first connection structure is a reflowed ball structure.

* * * * *